(12) United States Patent
Moon

(10) Patent No.: US 7,553,721 B2
(45) Date of Patent: Jun. 30, 2009

(54) FLASH MEMORY DEVICES AND METHODS OF FABRICATING THE SAME

(75) Inventor: Jae Yuhn Moon, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/950,256

(22) Filed: Dec. 4, 2007

(65) Prior Publication Data

US 2008/0149998 A1 Jun. 26, 2008

(30) Foreign Application Priority Data

Dec. 21, 2006 (KR) ............... 10-2006-0131663

(51) Int. Cl.
*H01L 21/8238* (2006.01)
(52) U.S. Cl. ............... 438/218; 257/607; 257/315; 257/E21.179; 257/E29.3; 257/E21.31; 438/712; 438/264; 438/257; 438/258
(58) Field of Classification Search ............... 257/607, 257/315, E21.179, E29.3, E21.31; 438/218, 438/257, 712, 264, 258
See application file for complete search history.

(56) References Cited

U.S. PATENT DOCUMENTS

2004/0175955 A1 * 9/2004 Haselden et al. ............ 438/757
2007/0259491 A1 * 11/2007 Nakagawa ................. 438/218

* cited by examiner

*Primary Examiner*—Cuong Q Nguyen
*Assistant Examiner*—Cathy N Lam
(74) *Attorney, Agent, or Firm*—Workman Nydegger

(57) ABSTRACT

Flash memory devices and methods for fabricating the same. In one example embodiment, a method of fabricating a flash memory includes various acts. First, a tunnel oxide layer is formed on an active region of a semiconductor substrate. Next, a gate region is formed by sequentially forming a floating gate, a gate insulating layer, and a control gate over the tunnel oxide layer. Then, a sidewall oxide layer is formed on a gate region. Next, a fluorine plasma ion implantation process is performed on the sidewall oxide layer. Then, a nitride layer is deposited on the sidewall oxide layer. Next, an etch process is performed to form spacer insulating layers.

6 Claims, 2 Drawing Sheets

FLASH MEMORY DEVICES AND METHODS OF FABRICATING THE SAME

CROSS-REFERENCE TO RELATED APPLICATION

This application claims priority to Korean Application No. 10-2006-0131663, filed on Dec. 21, 2006, which is incorporated herein by reference in its entirety.

BACKGROUND

1. Field of the Invention

The present invention relates, in general, to semiconductor flash memory devices and, more particularly, to semiconductor flash memory devices and methods of fabricating the same that can reduce an electron trap phenomenon after a sidewall oxide layer of a gate electrode is formed.

2. Description of the Related Art

In general, data stored in a semiconductor flash memory device persists even when power to the flash memory is turned off. This persistent characteristic of flash memory makes flash memory useful for data storage in applications such as PC bios, set-top boxes, printers, and network servers. In recent years, flash memory has also been widely used in portable devices such as digital cameras and mobile phones.

In an electrically erasable programmable read-only memory (EEPROM) type flash memory device capable of electrically erasing data in memory cells on a batch or sector basis, channel hot electrons are formed on the drain during programming. These channel hot electrons then accumulate on the floating gate, thus increasing the threshold voltage of a cell transistor. However, during erasure of the flash memory device, a high voltage is generated between the source/drain/substrate and the floating gate and electrons accumulated on the floating gate are discharged, thus lowering the threshold voltage of the cell transistor.

Cell structures of EEPROM type flash memory devices are classified as either an EEPROM thin oxide (ETOX) of a simple stack structure, or a split gate type cell including two transistors per cell. The ETOX cell structure has a structure in which a floating gate and a control gate are stacked. The split gate type cell structure has a structure in which a select transistor and two cell transistors are used, along with a control gate. One part of the control gate is overlapped with a floating gate and another part of which is disposed on a substrate.

FIG. 1 is a cross-sectional view of a conventional flash memory device fabricated according to a conventional method. As disclosed in FIG. 1, a conventional ETOX cell transistor is constructed by, first, sequentially stacking a tunnel oxide layer 12, a floating gate 14, an inter-gate insulating layer 16, and a control gate 18 on an active region of a semiconductor substrate 10. A source/drain 20 is then formed within the semiconductor substrate 10 on either side of a channel region positioned under the floating gate 14.

In the conventional flash memory device of FIG. 1, during programming a programming voltage is applied through word lines connected to the control gate 18 and bit lines connected to the source/drain 20. Electrons of the source/drain 20 are injected into the floating gate 14 through the tunnel oxide layer 12 in a hot carrier manner, so that programming of the cell transistor is performed. During erasure an erase voltage is applied through source lines connected to the source/drain 20. The electrons injected into the floating gate 14 are again discharged toward the channel through the tunnel oxide layer 12 to lower the threshold voltage of the cell transistor.

Unfortunately, as flash memory devices become increasingly integrated, data retention becomes increasingly problematic. In order to overcome this data retention problem, the floating gate and the control gate are sometimes covered with a gate insulating layer, and the sidewalls are covered with a sidewall oxide layer and a spacer nitride layer.

However, traps may result at the interface region due to damage that occurs when the floating gate of the sidewall parts is etched during the formation of the sidewall oxide layer. As electrons become trapped in the floating gate, data retention characteristic deteriorates.

SUMMARY OF EXAMPLE EMBODIMENTS

In general, example embodiments of the invention relate to semiconductor flash memory devices and methods of fabricating the same that can reduce or eliminate an electron trap phenomenon after a sidewall oxide layer of a gate electrode is formed. This reduction or elimination of the electron trap phenomenon can be accomplished by performing a fluorine plasma process to stably fix trap points at the interface of the sidewall oxide layer.

In one example embodiment, a method of fabricating a flash memory includes various acts. First, a tunnel oxide layer is formed on an active region of a semiconductor substrate. Next, a gate region is formed by sequentially forming a floating gate, a gate insulating layer, and a control gate over the tunnel oxide layer. Then, a sidewall oxide layer is formed on a gate region. Next, a fluorine plasma ion implantation process is performed on the sidewall oxide layer. Then, a nitride layer is deposited on the sidewall oxide layer. Next, an etch process is performed to form spacer insulating layers.

In another example embodiment, a flash memory device includes a tunnel oxide layer formed on an active region of a semiconductor substrate; a floating gate, a gate insulating layer, and a control gate sequentially formed over the tunnel oxide layer; a sidewall oxide layer formed on a gate region; and spacer insulating layers formed by performing an etch process after the nitride layer is deposited.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF EXAMPLE EMBODIMENTS

Figure 1:
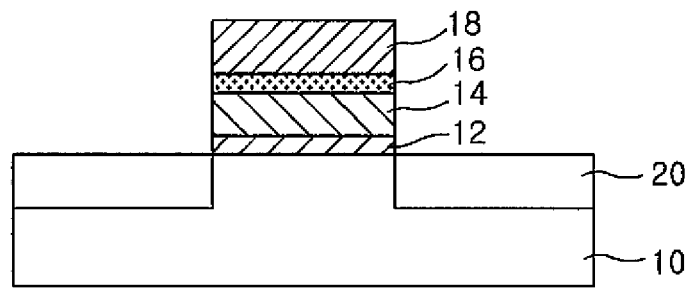
FIG. 1 is a cross-sectional view of a conventional flash memory device fabricated according to a conventional method.

Hereinafter, example embodiments of the invention will be described in detail with reference to the accompanying drawings.

FIGS. 2A-2D are cross-sectional views of an example flash memory device fabricating according to an example method. As disclosed in FIG. 2A, the example flash memory is fabricated by first forming a tunnel oxide layer 102 on an active region of a semiconductor substrate 100. Then, a gate region comprising a floating gate 104, a gate insulating layer 106, and a control gate 108 are sequentially formed over the tunnel oxide layer 102. Next, as disclosed in FIG. 2B, a sidewall oxide layer 110 is formed on the gate region. Next, as disclosed in FIG. 2C, after the sidewall oxide layer 110 is formed, a fluorine (F) plasma ion implantation process is performed on the sidewall oxide layer 110. This fluorine (F) plasma ion implantation process results in fluorine radical (F-) ions being infiltrated into the sidewall oxide layer 110. This fluorine (F) plasma ion implantation process also avoids the occurrence of an electron trap phenomenon at the interface region of the sidewall oxide layer 110 in a subsequent annealing process. Once the interface region of the sidewall oxide layer 110 is fixed by fluorine radical (F-) ions, further electron trap points are reduced or eliminated.

The fluorine plasma ion implantation process discussed above can be performed by performing plasma processing on a fluorine (F) gas. This plasma processing can include, for example, a fluorine (F) mixed gas of Ar/F=about 20 sccm to about 400 sccm/about 10 sccm to about 200 sccm, at a pressure of about 10 mTorr to about 100 mTorr, and at an RF power of about 150 W to 2000 W.

Figure 2A:
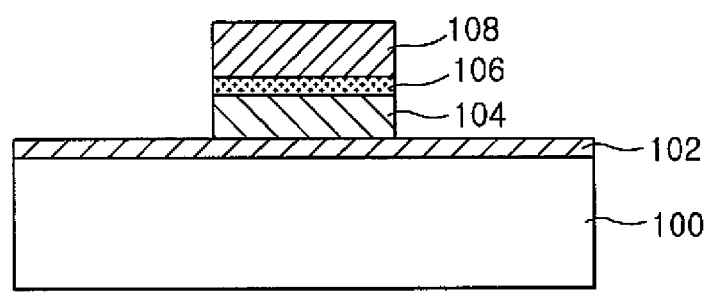
FIGS. 2A-2D are cross-sectional views of an example flash memory device fabricated according to an example method.
Figure 2B:
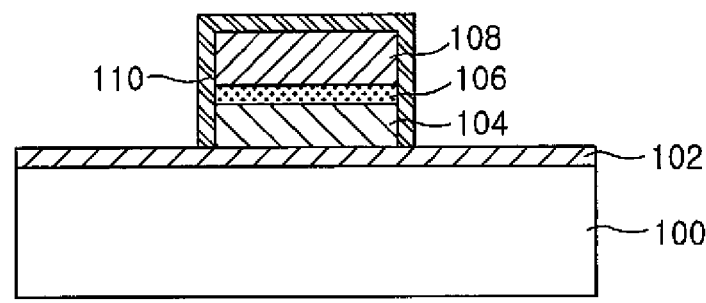
Figure 2C:
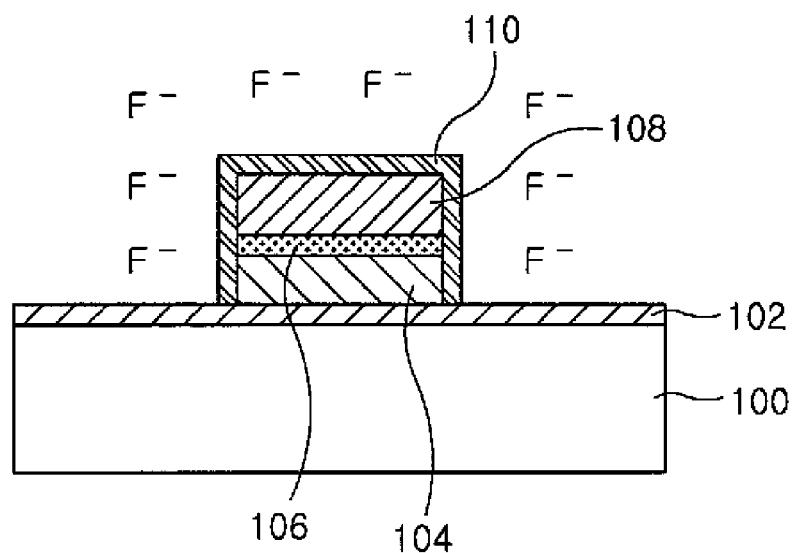
Figure 2D:
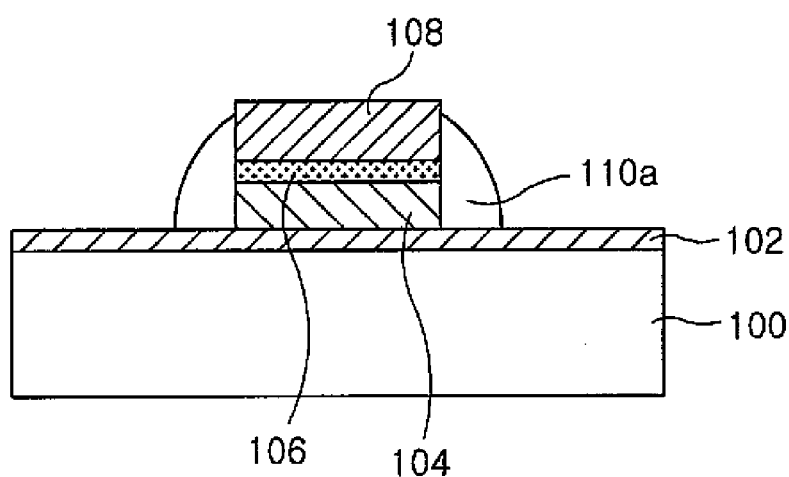

Next, as disclosed in FIG. 2D, after a nitride layer (not shown) is deposited, an etch process is performed to form spacer insulating layers 110a. Thereafter, other processes are performed such as an annealing process and an ion implantation process, thus forming source/drain regions on either side of a channel region positioned under the floating gate 104 within the semiconductor substrate 100.

As disclosed herein, a fluorine (F) plasma ion implantation process results in fluorine radical (F-) ions being infiltrated into the sidewall oxide layer 110, thus avoiding the occurrence of an electron trap phenomenon at the interface region of the sidewall oxide layer 110 in a subsequent annealing process. Once the interface region of the sidewall oxide layer 110 is fixed by fluorine radical (F-) ions, further electron trap points are reduced or eliminated. The elimination of an electron trap phenomenon improves data retention in flash memory devices.

While example embodiments have been shown and described, various changes and modifications may be made to the example embodiments. The example embodiments are thus to be considered as illustrative and not restrictive.

What is claimed is:

1. A method of fabricating a flash memory device, comprising the acts of:
   forming a tunnel oxide layer on an active region of a semiconductor substrate,
   forming a gate region by sequentially forming a floating gate, a gate insulating layer, and a control gate over the tunnel oxide layer;
   forming a sidewall oxide layer on the gate region;
   performing a fluorine plasma ion implantation process on the sidewall oxide layer;
   depositing a nitride layer; and
   performing an etch process to form spacer insulating layers.

2. The method of claim 1, wherein the fluorine plasma ion implantation process is performed such that a fluorine radical is infiltrated into the sidewall oxide layer thus reducing or eliminating electron trap points at an interface region of the sidewall oxide layer.

3. The method of claim 1, wherein the fluorine plasma ion implantation process is performed by using a mixed gas of argon and fluorine of Ar/F=about 20 sccm to about 400 sccm/about 10 sccm to about 200 sccm, at a pressure of about 10 mTorr to about 100 mTorr, and at an RE power of about 150 W to 2000 W.

4. A flash memory device, comprising:
   a tunnel oxide layer formed on an active region of a semiconductor substrate;
   floating gate, a gate insulating layer, and a control gate sequentially formed over the tunnel oxide layer;
   a sidewall oxide layer formed on a gate region; and
   spacer insulating layers formed by performing an etch process after the nitride layer is deposited,
   wherein the sidewall oxide layer comprises fluorine radical (F—) ions infiltrated into the sidewall oxide layer.

5. The flash memory device of claim 4, wherein the flash memory device is configured to substantially avoid the occurrence of an electron trap phenomenon at the interface region of the sidewall oxide layer.

6. The flash memory device of claim 4, further comprising source/drain regions on either side of a channel region positioned under the floating gate within the semiconductor substrate.

* * * * *